(12) United States Patent
Bloom et al.

(10) Patent No.: US 6,496,061 B1
(45) Date of Patent: Dec. 17, 2002

(54) HIGH EFFICIENCY MULTIPLE POWER LEVEL AMPLIFIER

(75) Inventors: Mark Bloom, Chandler, AZ (US); Kevin Choi, Thousand Oaks, CA (US)

(73) Assignee: Conexant Systems, Inc., Newport Beach, CA (US)

(*) Notice: Subject to any disclaimer, the term of this patent is extended or adjusted under 35 U.S.C. 154(b) by 183 days.

(21) Appl. No.: 09/686,440

(22) Filed: Oct. 10, 2000

(51) Int. Cl.[7] .............................. H03F 1/14; H03F 3/68
(52) U.S. Cl. ..................................... 330/51; 330/124 R
(58) Field of Search ...................... 330/51, 53, 124 R; 333/117

(56) References Cited

U.S. PATENT DOCUMENTS

| | | | | |
|---|---|---|---|---|
| 3,711,782 A | * | 1/1973 | Perrero et al. | 330/295 X |
| 4,053,848 A | * | 10/1977 | Kleische | 330/124 R X |
| 5,101,171 A | * | 3/1992 | Redmond | 330/124 R |
| 5,256,987 A | * | 10/1993 | Kibayashi et al. | 330/51 X |
| 5,430,411 A | * | 7/1995 | Boulis | 330/124 R X |
| 5,661,434 A | | 8/1997 | Brozovich et al. | 330/51 |
| 6,052,024 A | * | 4/2000 | Lo et al. | 330/124 R X |
| 6,362,685 B1 | * | 3/2002 | Vagher | 330/53 X |

* cited by examiner

Primary Examiner—Steven J. Mottola
(74) Attorney, Agent, or Firm—Thomas, Kayden, Horstemeyer & Risley, L.L.P.

(57) ABSTRACT

A high efficiency, multiple power output power amplifier uses a pair of amplifiers having similar characteristics coupled to a pair of radio frequency RF couplers. When both amplifiers are operating, the power output is the sum of the outputs of the two amplifiers. When lower power operation is desired, one of the amplifiers is turned off and a high impedance is presented to the isolated port of the output RF coupler, thereby ensuring that all of the power output of the remaining power amplifier is available for output.

15 Claims, 3 Drawing Sheets

HIGH EFFICIENCY MULTIPLE POWER LEVEL AMPLIFIER

BACKGROUND OF THE INVENTION

1. Technical Field

This invention relates generally to maximizing the efficiency of radio frequency power amplification in a wireless communication device transmitter, and, more particularly, to a high efficiency multiple power level amplifier.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld telephone-like communication handset. While the different modulation and transmission schemes each have advantages and disadvantages, one common factor is the need for highly efficient power amplification. As these communication devices become smaller and smaller, the functionality provided by these devices continues to increase. One major concern when developing these handheld communication devices is power consumption. As the devices become smaller and smaller, the amount of power consumed and dissipated becomes more and more critical. High efficiency power amplification decreases the amount of power consumed, thereby maximizing battery life of the device.

Another major concern in these wireless devices is the size of the circuitry. In order to minimize the hardware required it is desirable to integrate as much functionality as possible into fewer and fewer circuit modules. This enables the hand held device to be smaller and consume less power.

Most wireless power amplifier applications require high efficiency over a broad range of operating power levels. This is inherently difficult to achieve without circuitry and logic in addition to the power amplifier. Typically, additional circuitry residing on a control die must be used in addition to the power amplifier circuit.

One conventional manner in which to achieve high efficiency power amplification over a broad range of power output levels uses radio frequency (RF) switches to select different power amplifiers based upon the required power output demand. Each of the power amplifiers can be optimized for high efficiency at different power levels. Unfortunately, this solution requires the use of an additional control die in which to house the RF switches.

Another conventional manner in which to achieve high efficiency power amplification over a broad range of power output levels involves two separate amplifiers having different characteristics, each optimized for high efficiency at different power levels. In such an arrangement, the amplifiers are activated individually to satisfy the required power levels. Microwave couplers are used to ensure the correct phase match between the two amplifiers. Unfortunately, this approach still requires a separate control die and is difficult to achieve in commercial high-volume applications. Furthermore, the two different amplifiers must have a matched phase supplied at their input, thereby requiring that the microwave couplers be extremely stable.

Therefore, there is a need in the industry for a wireless power amplification circuit that achieves highly efficient power amplification over a broad range of output power levels and that is economical to produce in high volume.

SUMMARY

The invention provides a high efficiency multiple power level amplifier that maximizes power amplifier efficiency and minimizes the required control circuitry. The invention maximizes the efficiency of a power amplifier circuit and simultaneously minimizes the amount of control circuitry required to control the amplifier. Two amplifiers having similar amplification characteristics are connected to two RF couplers. The isolated port of each RF coupler is connected to an impedance modification circuit. The power amplifier circuit can use both amplifiers when power demand is high and use the output of a single power amplifier when power demand is lower. When using only one power amplifier, the impedance modification circuit eliminates the impedance mismatch caused by the single power amplifier operation by using an externally biased semiconductor to present the proper impedance to the coupler connected to the inactive power amplifier. In this manner, any impedance mismatch between the operative and inoperative power amplifiers is compensated, thus allowing the single operating power amplifier to achieve optimal performance.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The components in the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to portable transceiver, the high efficiency multiple power level amplifier can be implemented in any system where it is desirable to have both high and low power amplification.

Furthermore, the high efficiency multiple power level amplifier can be implemented in software, hardware, or a combination of software and hardware. In a preferred embodiment(s), selected portions of the high efficiency multiple power level amplifier are implemented in hardware and software. The hardware portion of the invention can be implemented using specialized hardware logic. The software portion can be stored in a memory and be executed by a suitable instruction execution system (microprocessor). The hardware implementation of the high efficiency multiple power level amplifier can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the high efficiency multiple power level amplifier software, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
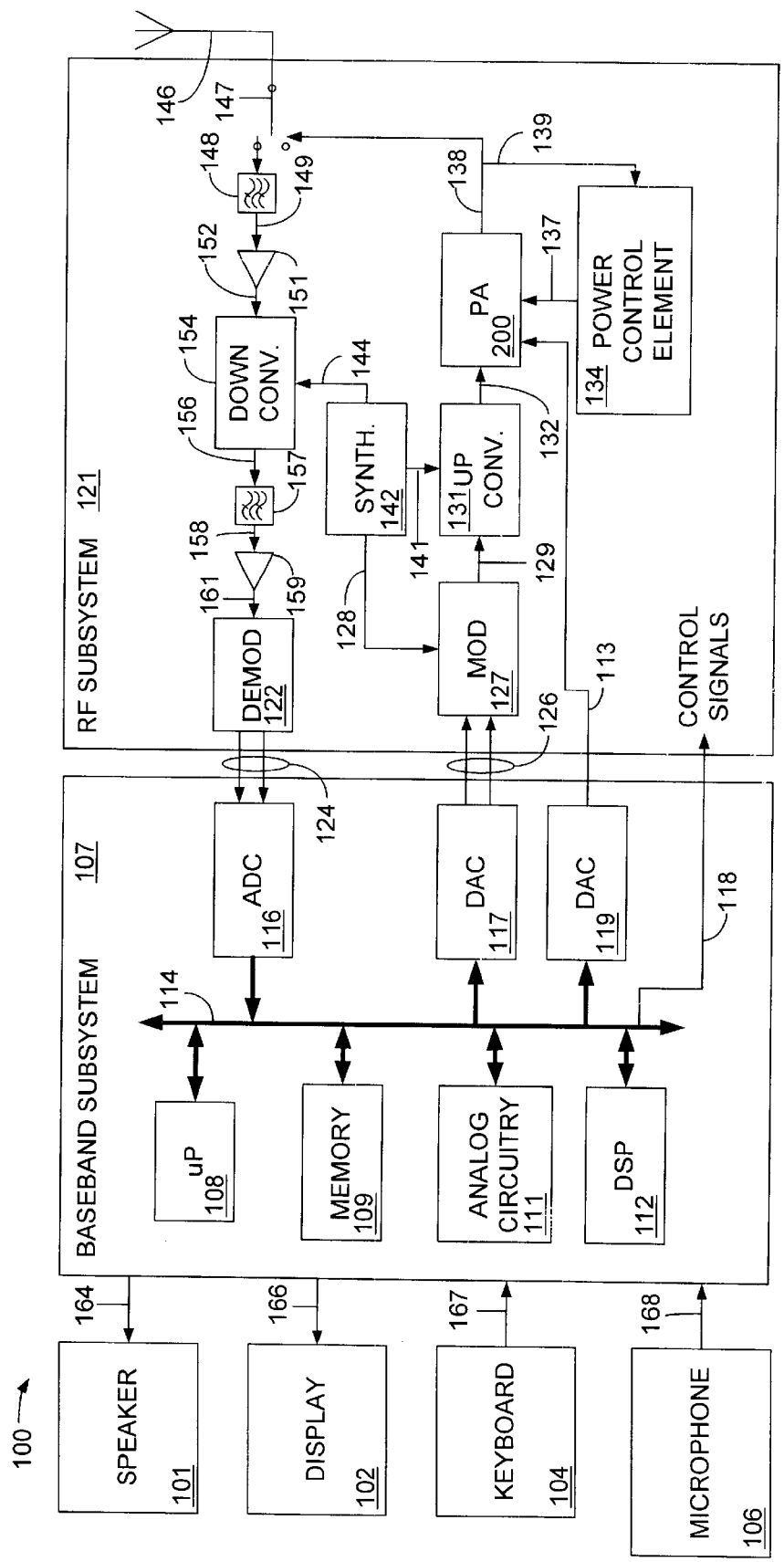
FIG. 1 is a block diagram illustrating a simplified portable transceiver.

FIG. 1 is a block diagram illustrating a simplified portable transceiver 100. Portable transceiver 100 includes speaker 101, display 102, keyboard 104, and microphone 106, all connected to baseband subsystem 107. In a particular embodiment, portable transceiver 100 can be, for example but not limited to, a portable telecommunication handset such as a mobile cellular-type telephone. Speaker 101 and display 102 receive signals from baseband subsystem 107 via connections 164 and 166, respectively, as known to those skilled in the art. Similarly, keyboard 104 and microphone 106 supply signals to baseband subsystem 107 via connections 167 and 168, respectively. Baseband subsystem 107 includes microprocessor ($\mu$P) 108, memory 109, analog circuitry 111, and digital signal processor (DSP) 112 in communication via bus 114. Bus 114, although shown as a single bus, may be implemented using multiple busses connected as necessary among the subsystems within baseband subsystem 107. Microprocessor 108 and memory 109 provide the signal timing, processing and storage functions for portable transceiver 100. Analog circuitry 111 provides the analog processing functions for the signals within baseband subsystem 107. Baseband subsystem 107 provides control signals to radio frequency (RF) subsystem 121 via connection 118. Although shown as a single connection 118, the control signals may originate from DSP 112 or from microprocessor 108, and are supplied to a variety of points within RF subsystem 121. It should be noted that, for simplicity, only the basic components of portable transceiver 100 are illustrated.

Baseband subsystem 107 also includes analog-to-digital converter (ADC) 116 and digital-to-analog converters (DACs) 117 and 119. ADC 116, DAC 117 and DAC 119 also communicate with microprocessor 108, memory 109, analog circuitry 111 and DSP 112 via bus 114. DAC 117 converts the digital communication information within baseband subsystem 107 into an analog signal for transmission to RF subsystem 121 via connection 126. DAC 119 provides a reference voltage power level signal to power amplifier 200 via connection 113. Connection 126, while shown as two directed arrows, includes the information that is to be transmitted by RF subsystem 121 after conversion from the digital domain to the analog domain.

RF subsystem 121 includes modulator 127, which after receiving a frequency reference signal, also called a local oscillator signal or LO from synthesizer 142 via connection 128, modulates the analog information on connection 126 and provides a modulated signal via connection 129 to upconverter 131. Upconverter 131 also receives a frequency reference signal from synthesizer 142 via connection 141. Synthesizer 142 determines the appropriate frequency to which upconverter 131 will upconvert the modulated signal on connection 129. The modulated signal on connection 129 may be any modulated signal, such as a phase modulated signal or an amplitude modulated signal. Furthermore, it is possible to supply a phase modulated signal to upconverter 131 and to introduce an amplitude modulated signal component into power amplifier 200 through the power amplifier's control channel. All possible modulation techniques can benefit from the invention to be described below.

Upconverter 131 supplies the modulated signal via connection 132 to power amplifier 200. Power amplifier 200 amplifies the signal on connection 132 to a variety of different power levels while maintaining a high efficiency level. Power amplifier 200 amplifies the modulated signal on connection 132 to the appropriate power level for transmission via connection 138 to antenna 146. Illustratively, switch 147 controls whether the amplified signal on connection 138 is transferred to antenna 146 or whether a received signal from antenna 146 is supplied to filter 148. The operation of switch 147 is controlled by a control signal from baseband subsystem 107 via connection 118.

A portion of the amplified transmit signal energy on connection 138 is supplied via connection 139 to power control element 134. Power control element 134 forms a closed power control feedback loop and, if desired, supplies an AM component of the transmit signal via control channel connection 137 to power amplifier 200.

A signal received by antenna 146 will, at the appropriate time determined by baseband system 107, be directed via switch 147 to receive filter 148. Receive filter 148 will filter the received signal and supply the filtered signal on connection 149 to low noise amplifier (LNA) 151. Receive filter 148 is a bandpass filter, which passes all channels of the particular cellular system in which the portable transceiver 100 is operating. As an example, in a 900 MHz GSM system, receive filter 148 would pass all frequencies from 935.1 MHz to 959.9 MHz, covering all 124 contiguous channels of 200 kHz each. The purpose of this filter is to reject all frequencies outside the desired region. LNA 151 amplifies the very weak signal on connection 149 to a level at which downconverter 154 can translate the signal from the transmitted frequency back to a baseband frequency. Alternatively, the functionality of LNA 151 and downconverter 154 can be accomplished using other elements; such as for example but not limited to, a low noise block downconverter (LNB).

Downconverter 154 receives a frequency reference signal, also called a local oscillator signal or LO from synthesizer 142, via connection 144. This LO signal instructs the downconverter 154 as to the proper frequency to which to downconvert the signal received from LNA 151 via connection 152. The downconverted frequency is called the intermediate frequency or "IF." Downconverter 154 sends the downconverted signal via connection 156 to channel filter 157, also called the "IF filter." Channel filter 157 filters the downconverted signal and supplies it via connection 158 to amplifier 159. The channel filter 157 selects the one desired channel and rejects all others. Using the GSM system as an example, only one of the 124 contiguous channels is actually to be received. After all channels are passed by receive filter 148 and downconverted in frequency by downconverter 154, only the one desired channel will appear precisely at the center frequency of channel filter 157. The synthesizer 142, by controlling the local oscillator frequency supplied on connection 144 to downconverter 154, determines the selected channel. Amplifier 159 amplifies the received signal and supplies the amplified signal via connection 161 to demodulator 122. Demodulator 122 recovers the transmitted analog information and supplies a signal representing this information via connection 124 to ADC 116. ADC 116 converts these analog signals to a digital signal at baseband frequency and transfers it via bus 114 to DSP 112 for further processing.

Figure 2:
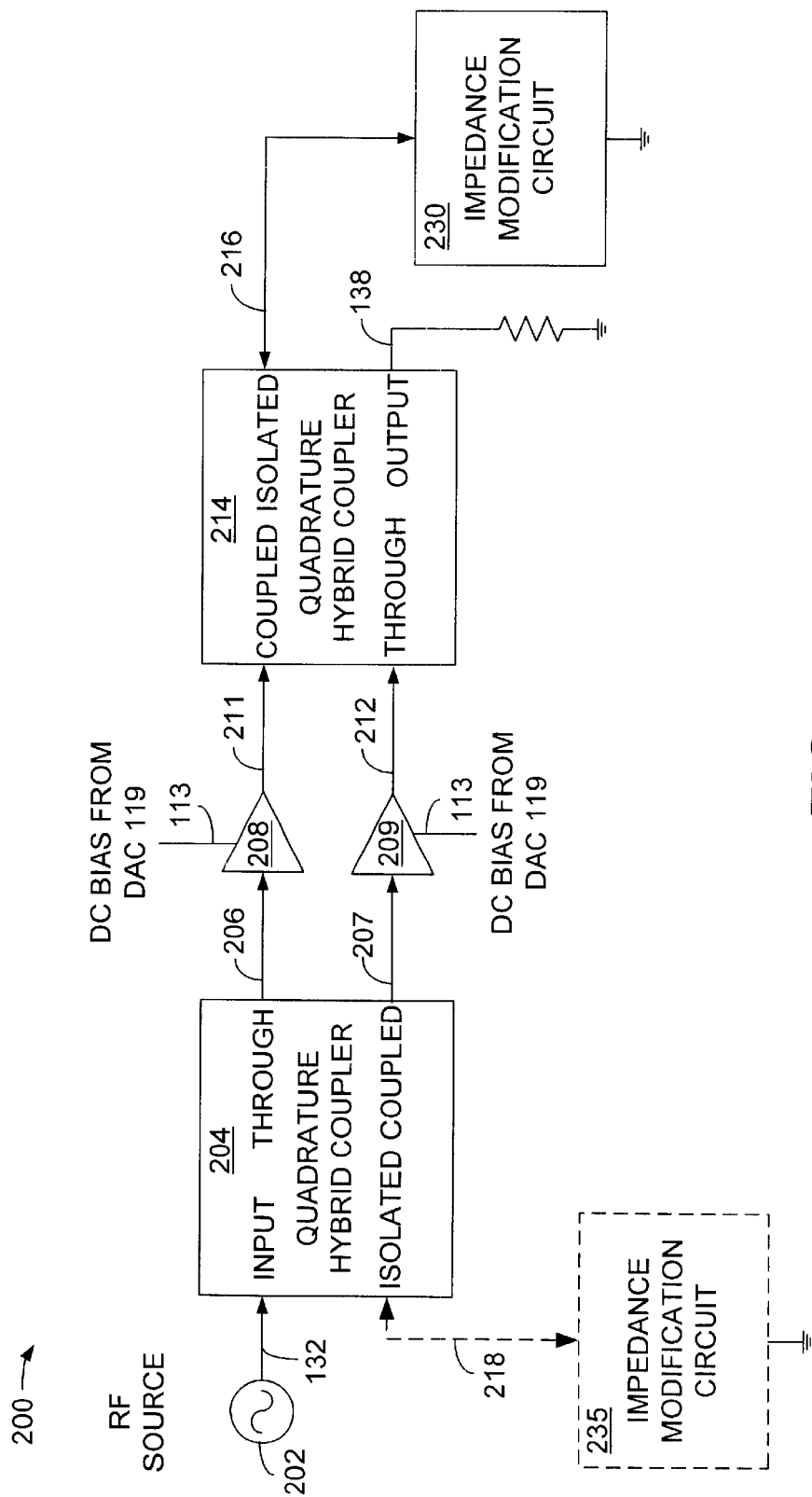
FIG. 2 is a block diagram illustrating the power amplifier of FIG. 1.

FIG. 2 is a block diagram illustrating the power amplifier 200 of FIG. 1. RF source 202, which in FIG. 2 is illustrated as an oscillator that includes the functionality of modulator 127 and upconverter 131 of FIG. 1, supplies a modulated and upconverted signal via connection 132 to input coupler 204. Input coupler 204 may be a quadrature hybrid coupler or any other RF coupling device capable of splitting and combining RF energy. Input coupler 204 includes a through port and a coupled port. The through port imparts a 0° phase shift on the signal on connection 206 and the coupled port imparts a –90° phase shift on the signal on connection 207. The through port of input coupler 204 connects to an input of first amplifier 208 via connection 206. The coupled port of input coupler 204 connects to an input of second amplifier 209 via connection 207.

Amplifiers 208 and 209 each receive a direct current (DC) bias signal via connection 113 from the DAC 119 of FIG. 1. Amplifier 208 and amplifier 209, while not necessarily identical, typically have similar operating characteristics. The DC bias signal via connection 113 controls the operation of amplifiers 208 and 209 and determines whether the amplifiers are on or off. First amplifier 208 connects via connection 211 to the coupled port of output coupler 214 and second amplifier 209 connects via connection 212 to the through port of output coupler 214. Output coupler 214 is also a quadrature hybrid coupler, similar in function to input coupler 204. Input coupler 204 and output coupler 214 each also include an isolated port, which typically connects through a 50 ohm resistor to ground.

First amplifier 208 and second amplifier 209 have similar operating characteristics and when operated together provide an output via connection 138 of output coupler 214. When both amplifier 208 and amplifier 209 are operating, the output present at connection 138 is the sum of the outputs of each amplifier 208 and 209. However, there are conditions under which it may be desirable to provide less than full power output. For example, when conditions permit, it would be desirable to have a lower power output to conserve battery power while still maintaining amplifier output efficiency. Unfortunately, if one amplifier were turned off, the apparent phase difference between the coupled port and the through port of input coupler 204 and output coupler 214, along with the impedance mismatch caused by turning off one of the amplifiers, prevents the one remaining operating amplifier from providing its full power. For example, instead of providing half the power output of two amplifiers, a single amplifier in such an arrangement would provide merely 20% to 25% of its possible power output.

Therefore, an impedance modification circuit 230 is connected to the isolated port of output coupler 214 via connection 216. The impedance modification circuit 230 (to be described in further detail below with respect to FIG. 3), operates in cooperation with amplifiers 208 and 209, so that when amplifier 209 is turned off, impedance modification circuit 230 will present a very high impedance to the isolated port of output coupler 214. The high impedance allows the one remaining operating amplifier (amplifier 208) to efficiently provide its full output power via connection 138. In other words, by changing the impedance at the isolated port of output coupler 214, significantly more power generated by amplifier 208 can be available at the output port of output coupler 214 via connection 138 than possible without the impedance modification circuit 230. In this manner, the power amplifier 200 can operate efficiently at both high power output and low power output.

Figure 3:
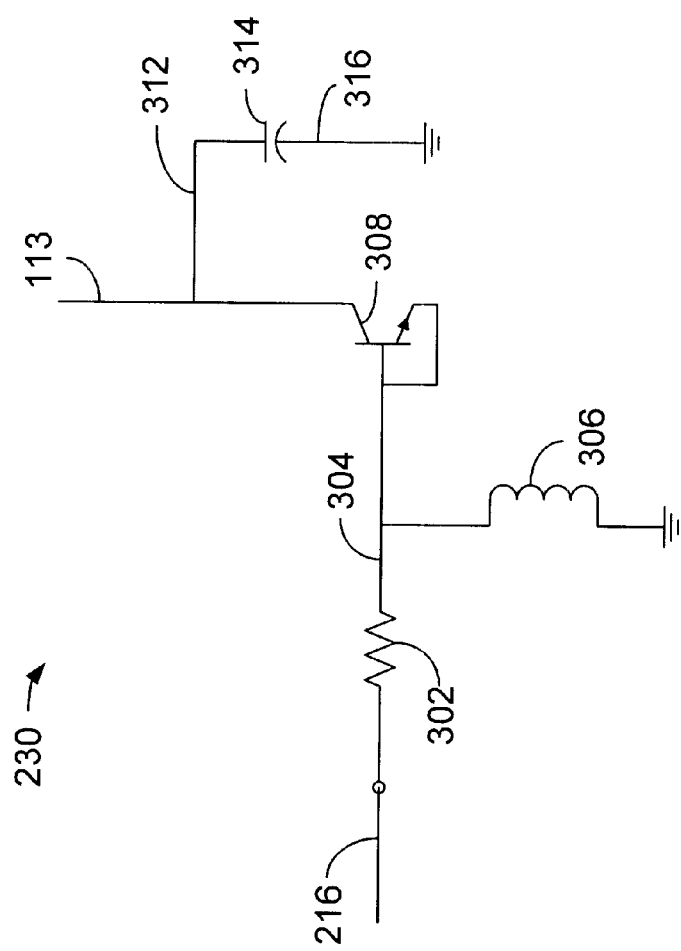
FIG. 3 is a schematic view illustrating, in further detail, the impedance modification circuit of FIG. 2.

FIG. 3 is a schematic view illustrating, in further detail, the impedance modification circuit 230 of FIG. 2. Impedance modification circuit 230 couples to the isolated port of output coupler 214 (FIG. 2) via connection 216. A resistive element, such as a resistor 302, which may have a value of 50 ohms, presents a load to the isolated port of output coupler 214 at all times. When both amplifiers 208 and 209 are operating, the diode 308 of FIG. 3 is forward biased into a conductive state caused by a negative voltage applied via connection 113 (from DAC 119 of FIG. 1). Alternatively, the diode 308 can be forward biased by the negative components of the signal present on connection 216 if zero voltage is applied via connection 113. Forward biasing the diode 308 connects the resistor 302 through bypass capacitor 314, which behaves as a short circuit for AC signals, and connection 316 directly to ground. In this manner, an impedance resulting from the 50 ohm resistance is presented to the isolated port of output coupler 214 at connection 216. If a zero volt signal is applied via connection 113, then any negative components of the signal present on connection 216 will enable conduction through the diode 308.

When it is desirable to provide lower power from power amplifier 200, amplifier 209 is switched off via a control signal from connection 113 and, simultaneously therewith, diode 308 is reverse biased by the application of a positive voltage via connection 113 causing diode 308 to stop conducting. When diode 308 is reverse biased, an extremely high impedance is presented to the isolated port of coupler 214 (FIG. 2) via resistor 302 and inductor 306, which behaves as an open circuit to the AC signal on connection 304. In this manner, all power generated by amplifier 208 can be available at the output port of output coupler 214 via connection 138 (FIG. 2).

Advantageously, the diode 308 and the amplifiers 208 and 209 can be implemented using the same manufacturing processing technology. For example, gallium arsenide (GaAs) heterojunction bipolar transistor (HBT) technology can be used to fabricate both the diode 308 and the power amplifiers 208 and 209 on the same die.

The input coupler 204 and the output coupler 214 form a "balanced amplifier" configuration. Under high power operation, both amplifiers 208 and 209 operate together, yielding an output power approximately equal to the sum of their individual output powers. Under low power operation, amplifier 209 and diode 308 can be simultaneously switched off, in which case a high impedance is presented to the isolated port of output coupler 214. This high impedance is fed back at the correct phase to the single remaining operating amplifier 208, which allows the amplifier 208 to be presented with a matched 50 ohm environment. In this manner, the single remaining amplifier 208 operates under optimal load conditions and delivers a power level approximately 3 dB lower than that delivered when both amplifiers 208 and 209 are operating. Although illustrated using a diode to modify the impedance presented to the amplifier 208, other devices may be used to modify the impedance. For example, it would be possible to use an RF switch, a field effect transistor, or a bipolar device biased under different conditions to modify the impedance.

Referring back to FIG. 2, impedance modification circuit 235 can be coupled to the isolated port of input coupler 204. The impedance modification circuit 235 connects via connection 218 to the isolated port of input coupler 204 and is shown using dotted lines to illustrate that it is optional. In the absence of impedance modification circuit 235, a 50 ohm resistance may be connected to the isolated port of input coupler 204. Impedance modification circuit 235 is similar in structure and operation to impedance modification circuit 230 described above with respect to FIG. 3.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for operating a high efficiency, multiple output level power amplifier, comprising the steps of:
   providing a modulated signal to a first radio frequency (RF) coupler, the RF coupler coupled to an input of a first power amplifier and an input of a second power amplifier;
   coupling an output of the first power amplifier and an output of the second power amplifier to a second RF coupler;
   coupling an isolated port of the second RF coupler through a resistance to an impedance modification circuit;
   operating the impedance modification circuit to connect the isolated port of the second RF coupler through the resistance to ground when the first and second power amplifiers are operating; and
   preventing the isolated port of the second RF coupler from being connected to ground through the resistance when the second power amplifier is switched off.

2. The method of claim 1, further comprising the step of presenting a high impedance to an isolated port of the second RF coupler when the second power amplifier is switched off.

3. The method of claim 1, further comprising the step of presenting a high impedance to an isolated port of the first RF coupler when the second power amplifier is switched off.

4. The method of claim 1, wherein the impedance modification circuit, the first power amplifier and the second power amplifier are fabricated using hetero-bipolar junction (HBT) technology.

5. The method of claim 1, wherein the impedance modification circuit comprises a diode.

6. The method of claim 1, wherein the impedance modification circuit comprises an RF switch.

7. The method of claim 1, wherein the impedance modification circuit is a field effect transistor (FET).

8. The method of claim 1, wherein the impedance modification circuit is a bipolar semiconductor.

9. A high efficiency, multiple output level power amplifier, comprising:
   a first radio frequency (RF) coupler connected to an input of a first power amplifier and connected to an input of a second power amplifier, the first power amplifier and the second power amplifier each having a bias terminal connected to a direct current (DC) bias voltage source;
   a second radio frequency (RF) coupler connected to an output of the first power amplifier and connected to an output of the second power amplifier; and
   a diode having a bias terminal connected to the DC bias voltage source and a first terminal connected through a resistance to an isolated port of the second RF coupler.

10. The amplifier of claim 9, wherein the DC bias voltage source causes the diode to connect the isolated port of the second RF coupler to ground through the resistance when the first power amplifier and the second power amplifier are active.

11. The amplifier of claim 9, wherein the DC bias voltage source causes the diode to enter a non-conducting state when the second power amplifier is inactive.

12. The amplifier of claim 11, wherein the diode in a non-conductive state presents a high impedance to the isolated port of the second RF coupler.

13. The amplifier of claim 9, further comprising a second diode connected to an isolated port of the first RF coupler.

14. A high efficiency, multiple output level power amplifier, comprising:
   means for providing a modulated signal to a first radio frequency (RF) coupler, the RF coupler coupled to an input of a first power amplifier and an input of a second power amplifier;
   means for coupling an output of the first power amplifier and an output of the second power amplifier to a second RF coupler;
   means for coupling an isolated port of the second RF coupler through a resistance to a diode;
   means for operating the diode to connect the isolated port of the second RF coupler through the resistance to ground when the first and second power amplifiers are operating; and
   means for preventing the isolated port of the second RF coupler from being connected to ground through the resistance when the second power amplifier is switched off.

15. A computer readable medium having a program for operating a high efficiency, multiple output level power amplifier, comprising the steps of:
   providing a modulated signal to a first radio frequency (RF) coupler, the RF coupler coupled to an input of a first power amplifier and an input of a second power amplifier;
   coupling an output of the first power amplifier and an output of the second power amplifier to a second RF coupler;
   coupling an isolated port of the second RF coupler through a resistance to An impedance modification circuit;
   operating the impedance modification circuit to connect the isolated port of the second RF coupler through the resistance to ground when the first and second power amplifiers are operating; and
   preventing the isolated port of the second RF coupler from being connected to ground through the resistance when the second power amplifier is switched off.

* * * * *